United States Patent [19]

Yamada

[11] Patent Number: 5,432,109

[45] Date of Patent: Jul. 11, 1995

[54] DEVICE METHOD FOR MANUFACTURING A SEMICONDUCTOR MEMORY

[75] Inventor: Seiji Yamada, Tokyo, Japan

[73] Assignee: Kabushiki Kaisha Toshiba, Kawasaki, Japan

[21] Appl. No.: 889,281

[22] Filed: May 28, 1992

[30] Foreign Application Priority Data

May 28, 1991 [JP] Japan ................................ 3-121690

[51] Int. Cl.⁶ .......................................... H01L 21/336
[52] U.S. Cl. ......................................... 437/43; 437/69
[58] Field of Search ........................... 437/43, 228, 69

[56] References Cited

U.S. PATENT DOCUMENTS

| | | |
|---|---|---|
| 4,258,466 | 3/1981 | Kuo et al. |
| 4,317,273 | 3/1982 | Guterman et al. |
| 4,326,331 | 4/1982 | Guterman |
| 4,500,899 | 2/1985 | Shirai et al. ......................... 357/23 |
| 5,045,489 | 9/1991 | Gill et al. ............................. 437/43 |

Primary Examiner—George Fourson
Attorney, Agent, or Firm—Banner, Birch, McKie & Beckett

[57] ABSTRACT

A method for manufacturing a floating gate field effect transistor includes the steps of forming a plurality of first band-like insulating films over a semiconductor substrate in a parallel, spaced-apart relation and a second insulating film between the first insulating films and having a thickness smaller than that of the first insulating film, forming a plurality of first conductive layers selectively over the insulating layer and a plurality of second band-like conductive layers over the first conductive layers in a spaced-apart relation and in a direction perpendicular to the first and second insulating films, the first conductive layer having a width substantially the same as that of the second conductive layer, coating a first resist over a whole surface of a resultant structure and patterning it so as to protect a substantive source region, removing the first insulating film at those areas not covered by the first resist, removing the first resist, forming a third insulating film by a thermal oxidation, and implanting an impurity ion into an element formation area in the semiconductor substrate in a self-aligned relation to the source region of a first conductivity type and forming a first impurity region, the conductivity type of the impurity being opposite to that of the substrate.

9 Claims, 11 Drawing Sheets

DEVICE METHOD FOR MANUFACTURING A SEMICONDUCTOR MEMORY

BACKGROUND OF THE INVENTION

1. Field of the Invention

The present invention relates to a method for manufacturing a nonvolatile semiconductor memory device and, in particular, to a method for forming source regions in a nonvolatile memory cell.

2. Description of the Related Art

An ETOX (EROM with Tunnel Oxide) type flash EEPROM is normally manufactured by the following steps.

A nitride film is provided over element areas at the surface portion of a semiconductor substrate and a field oxide film is formed subsequent to a selective oxidation, followed by the removal of the nitride film. Then the known steps follow, that is, the formation of a gate oxide film, a polycrystalline silicon layer, a cell slit, an $SiO_2/Si_3N_4/SiO_2$ (ONO) stacking film and a polycrystalline silicon layer. Then in order to form a memory cell, a resist pattern is provided, followed by an etching step. The removal of the resist pattern, formation of an oxide film and formation of a resist pattern for source region formation are effected. Then an ion implantation step is carried out. After the removal of the resist pattern, an impurity in the source region is diffused by a heating step and a resist pattern is formed so as to form a drain region. Then another ion implantation is conducted.

However, a mask misalignment occurs upon the formation of the polycrystalline layer, the ONO film, the polycrystalline layer and the gate oxide film with the use of a resist pattern. Therefore, the channel width adjacent to the source region differs from cell to cell. For the ETOX type flash EEPROM, a variation in the width of the channel adjacent to the source region causes a larger variation in the erasing characteristic of the cell.

FIG. 7 is a cross-sectional view showing one step of the manufacture of a nonvolatile semiconductor memory device in the case where the method of the present invention is not applied. FIG. 7 shows a semiconductor substrate 201, a gate oxide film 202, a floating gate 203, an interlevel insulating film 204, a control gate 205 and a resist 206, respectively. Usually, SAS (self-aligned source) technique is utilized upon the manufacture of an EPROM (electrical programmable ROM). In this SAS technique, since source field is formed so as to be self-aligned, it is possible to avoid channel width differences in each cell. However, there is a problem with the SAS technique that is, upon the formation of a source line after a dual-gate structure has been provided, not only a field oxide film but also an element area is exposed and a portion 207 of the element area is damaged by an overetching so that the characteristic of a source region is degenerated.

SUMMARY OF THE INVENTION

It is accordingly the object of the present invention to provide a method for manufacturing a nonvolatile semiconductor memory device having a source region of high reliability without involving an overetching against an element area.

According to the present invention, there is provided a method for manufacturing a floating gate field effect transistor structure including the steps of:

(1) forming a plurality of first band-like insulating films over a semiconductor substrate in a parallel, spaced-apart relation and a second insulating film between the first insulating films and having a thickness smaller than that of the first insulating film;

(2) forming a plurality of first conductive layers selectively over the insulating layer and a plurality of second band-like conductive layers over the first conductive layers in a spaced-apart relation and in a direction perpendicular to the first and second insulating films, the first conductive layer having a width substantially the same as that of the second conductive layer;

(3) coating a first resist over a whole surface of a resultant structure and patterning it so as to protect a substantive source region;

(4) removing the first insulating film at those areas not covered by the first resist;

(5) removing the first resist;

(6) forming a third insulating film by a thermal oxidation; and (7) implanting an impurity ion into an element formation area in the semiconductor substrate in a self-aligned relation to the source region of a first conductivity type and forming a first impurity region, the conductivity type of the impurity being opposite to that of the substrate.

In the method for manufacturing an EEPROM in accordance with the present invention, patterning is effected by the third step (3) in a gate-to-gate area including substantially source regions and, when the first insulating film is etched by the step (4), an element formation area in the EEPROM is prevented from an overetching whereby it is possible to prevent degeneration the characteristic of the source region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

One embodiment of the present invention will be explained in more detail below by referring to the accompanying drawings.

FIGS. 1 to 6 show the main steps of manufacturing an ETOX EEPROM. Of these Figures, plan views are represented in A to the corresponding Figure and cross-sectional views B, C, D and E are views as along lines II–II', III–III', IV–IV' and V–V', respectively, in the corresponding Figures.

Figure 1:
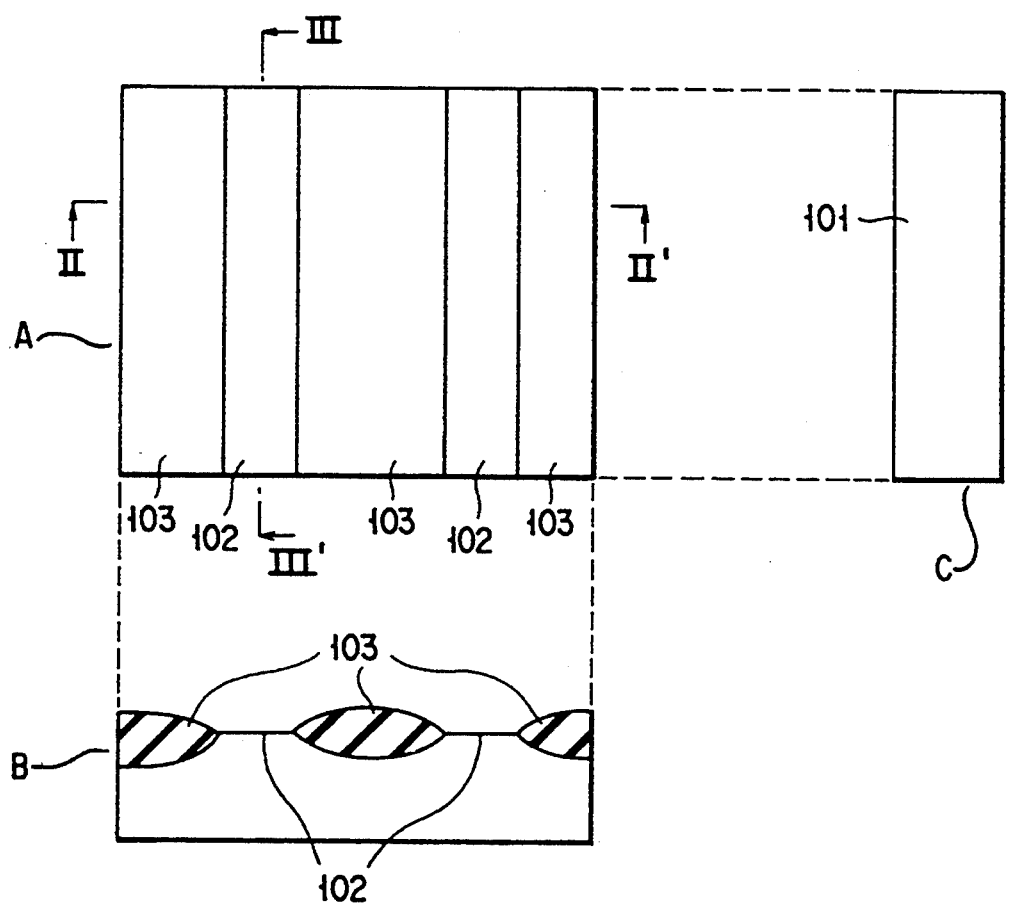
FIG. 1 shows a plan view at A and cross sectional views at B, C showing one step of manufacturing a nonvolatile semiconductor device according to a method of the present invention, and the cross sectional view at B is taken along line II–II', and the cross sectional view at C is taken along line III–III'.
Figure 2:
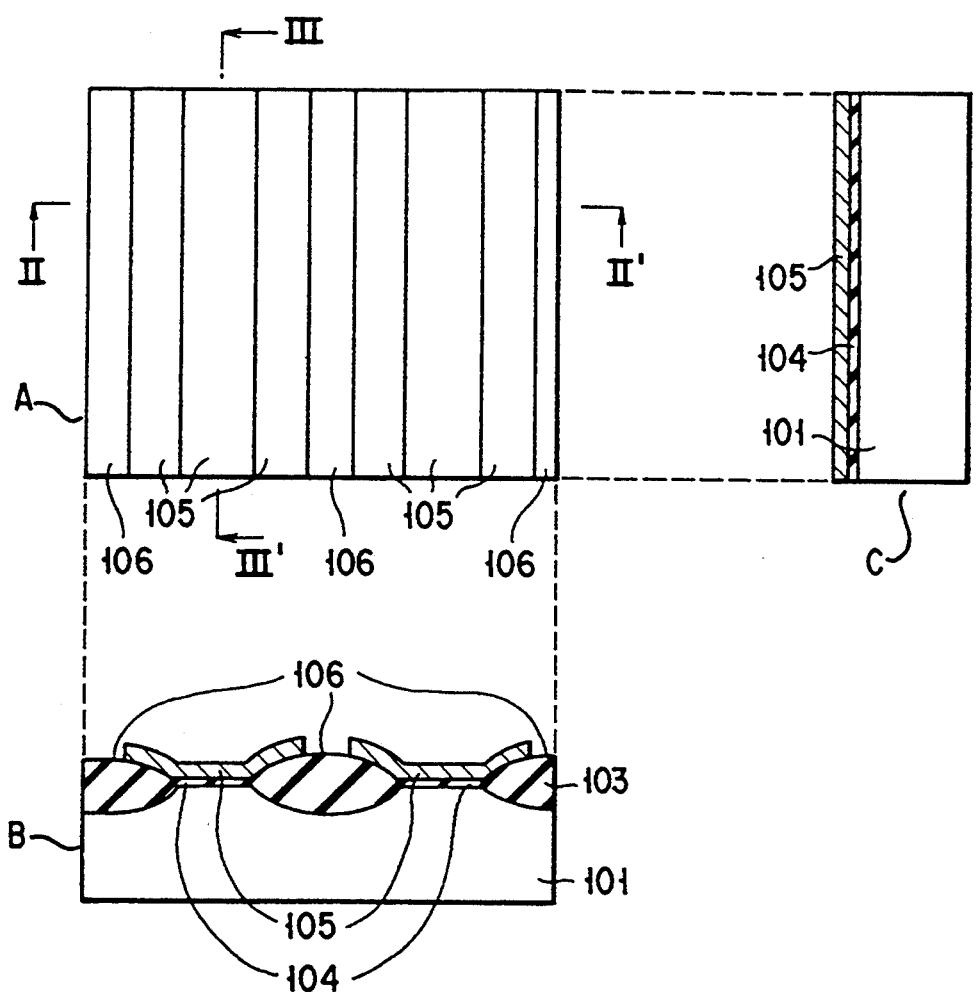
FIG. 2 shows a plan view at A and cross sectional views at B, C showing a step following the step of FIG. 2, and the cross sectional view at B is taken along line II–II', and the cross sectional view at C is taken along line III–III'.

As shown in FIG. 1, element regions 102 and field areas 103 are provided as band-like regions or areas, by a LOCOS (Local Oxidation of Silicon) method, over a P type silicon wafer 101 as shown in FIG. 1. In this case, a source line formation section is not formed as an element area. A channel stop, not shown, is formed below the field area 103.

An about 10 nm-thick sacrifice oxide film, not shown, acting as a buffer upon the implantation of an ion for threshold control is formed by a thermal oxidation method over the surface of the element region. Then a predetermined impurity ion for threshold control is implanted in a channel formation area through the sacrifice oxide film, followed by the removal of the sacrifice oxidation film with, for example, an NH$_4$F solution. A gate oxide film 104 about 10 nm thick is grown, as a gate insulating film, on the semiconductor structure by the thermal oxidation method. A polysilicon 105 about 100 nm is deposited, as a floating gate electrode, over the semiconductor structure by a LPCVD (low pressure chemical vapor deposition) method. An impurity is diffused in a polysilicon 105 through the thermal diffusion of POCl$_3$. Then a resist, not shown, is coated on the semiconductor structure, followed by a patterning step for cell slit (106) formation, a step of removing the polysilicon 105 by an anisotropic etching and a step of removing the resist, not shown.

An SiO$_2$/Si$_3$N$_4$/SiO$_2$ (ONO) stacking film 107 is formed, as an interlevel insulating film, over the whole surface of the semiconductor structure to obtain a suitable composition ratio. A polysilicon layer 108 about 400 nm is deposited, as a control gate electrode over the semiconductor structure by the LPCVD method. An impurity ion is diffused in the polysilicon 108 through the thermal diffusion of POCl$_3$.

Figure 3:
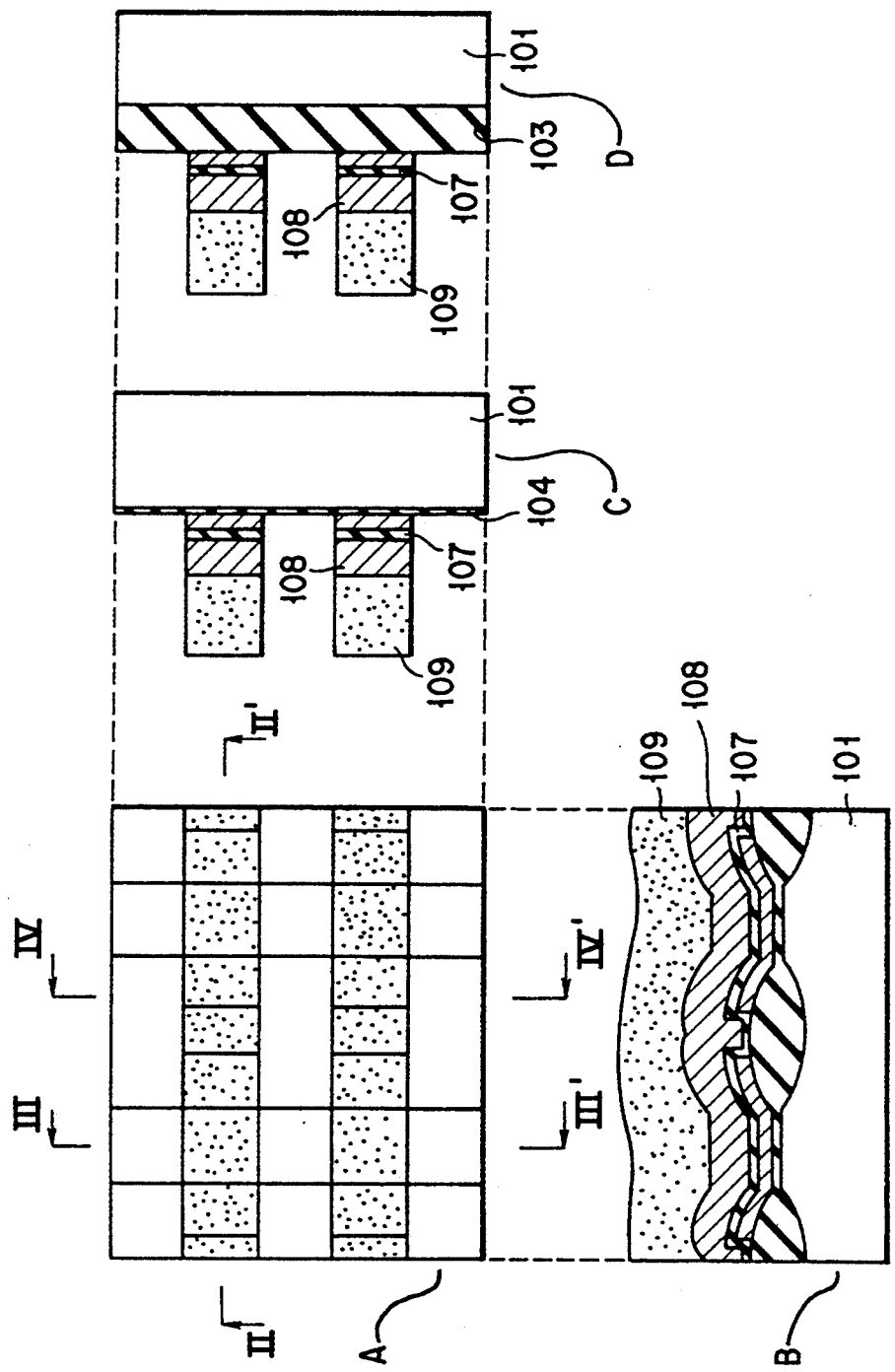
FIG. 3 shows a plan view at A and cross sectional views at B, C, D showing a step following the step of FIG. 4, and the cross sectional view at B is taken along line II–II', the cross sectional view at C is taken along line III–III', and the cross sectional view at D is taken along line IV–IV'.

As shown in FIG. 3, a resist 109 is coated over the semiconductor structure, followed by a patterning step for dual gate formation and steps of the removal of the polysilicon layer 108, ONO film 107 and polysilicon layer 106 sequentially with the use of the anisotropic etching. By so doing, a plurality of first band-like conductive layers (control gates 108) are provided in a spaced-apart relation in a direction perpendicular to that in which the field area 103 and gate oxide film 104 extend. A plurality of second band-like conductive layers (floating gates 106) are provided such that, below the first conductive layers 108, they are selectively located over the gate oxide film 104. In this connection it is to be noted that the second band-like conductive layer has substantially the same width as that of the first band-like conductive layer.

Figure 4A:
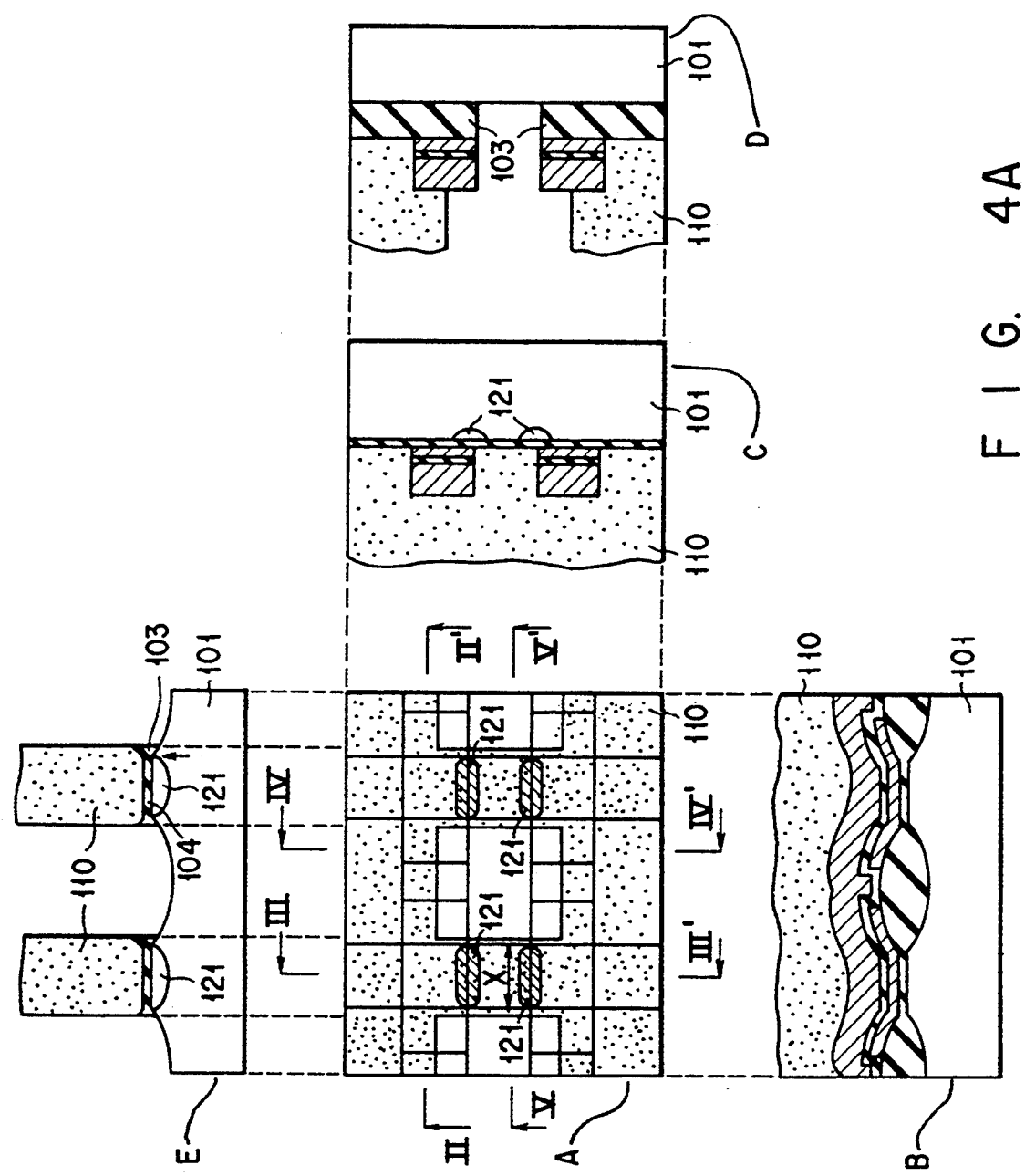
FIG. 4A shows a plan view at A and cross sectional views at B, C, D, E showing a step following the step of FIG. 3, and the cross sectional view at B taken along line II–II', the cross sectional view at C taken along line III–III', the cross sectional view at D taken along line IV–IV', and the cross sectional view at E taken along line V–V'.

Then the resist pattern 109 is removed and again a resist 110 is coated over the whole surface of the semiconductor structure and patterning is carried out as shown in FIG. 4A. The field oxide film 103 is selectively etched, by the anisotropic etching, at those exposed areas not covered with the resist.

According to the present invention, in order to stabilize the characteristic of source regions, the source regions 121 which might be damaged by an etching step are protected with the resist so that no etching is done there.

Figure 8:
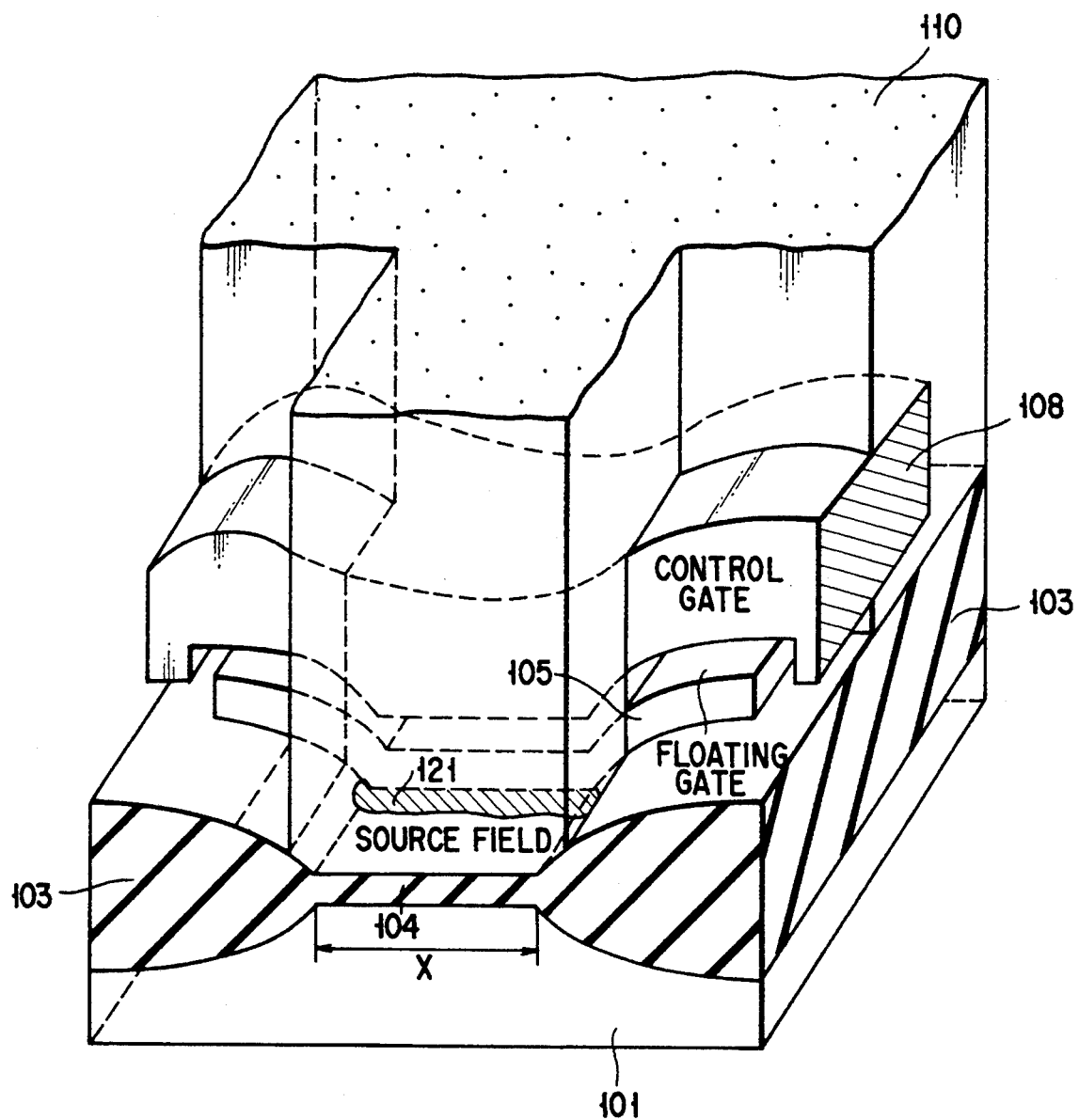
FIG. 8 is a concept diagram showing a step following a step of FIG. 3.

FIG. 8 is a diagrammatic view showing the manufacturing steps of the semiconductor device. It is the source field in FIG. 8 that is protected from an overetching involved. To this end, various resist distribution patterns may be conceived.

In the example shown in FIG. 4A, a gate-to-gate area including those source regions 121 is covered, in a distribution direction of the gate element 108, with a resist over a range somewhat broader than a gate width X so that the overetching of the source region 121 can be prevented.

In this case, after the completion of a corresponding etching step, an EEPROM can be manufactured according to the present invention in which case the first insulating film 103 is obtained as shown in FIG. 4A, cross sectional view at E.

Figure 4B:
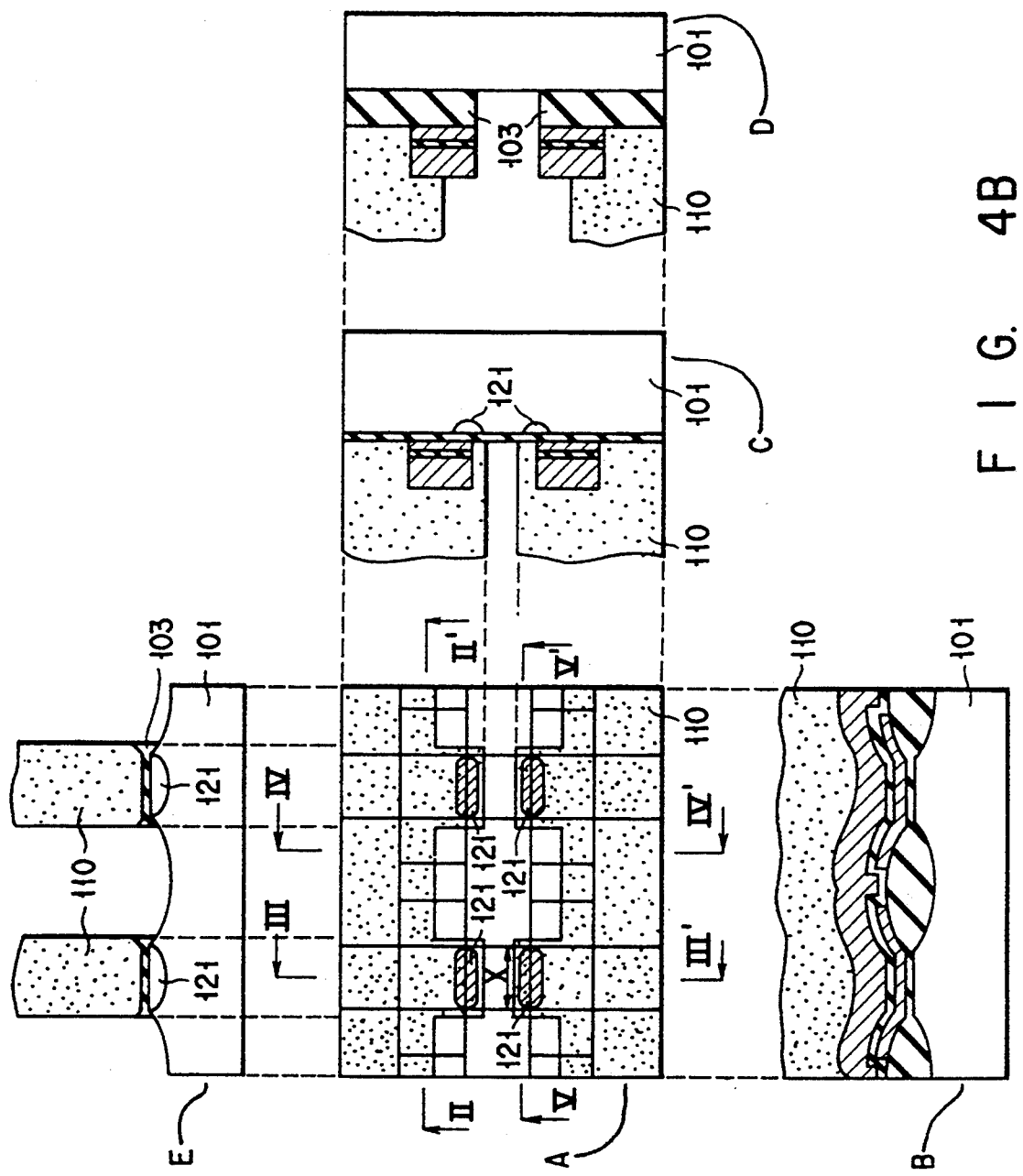
FIG. 4B shows a plan view at A and cross sectional views at B, C, D, E showing another step following the step of FIG. 3, and the cross sectional view at B is taken along line II–II', the cross sectional view at C is taken along line III–III', the cross sectional view at D is taken along line IV–IV', and the cross sectional view at E is taken along line V–V'.

In the example 4B, a gate-to-gate area including those source regions 121 is substantially covered with a resist except for an etched area between the sources 121 and hence between the gates, that is, the gate-to-gate area is not wholly covered with the resist as seen in FIG. 4B, cross sectional view at E. The resist, even though being so distributed, can protect substantial source regions and it is possible to gain the advantage of the present invention.

Figure 4C:
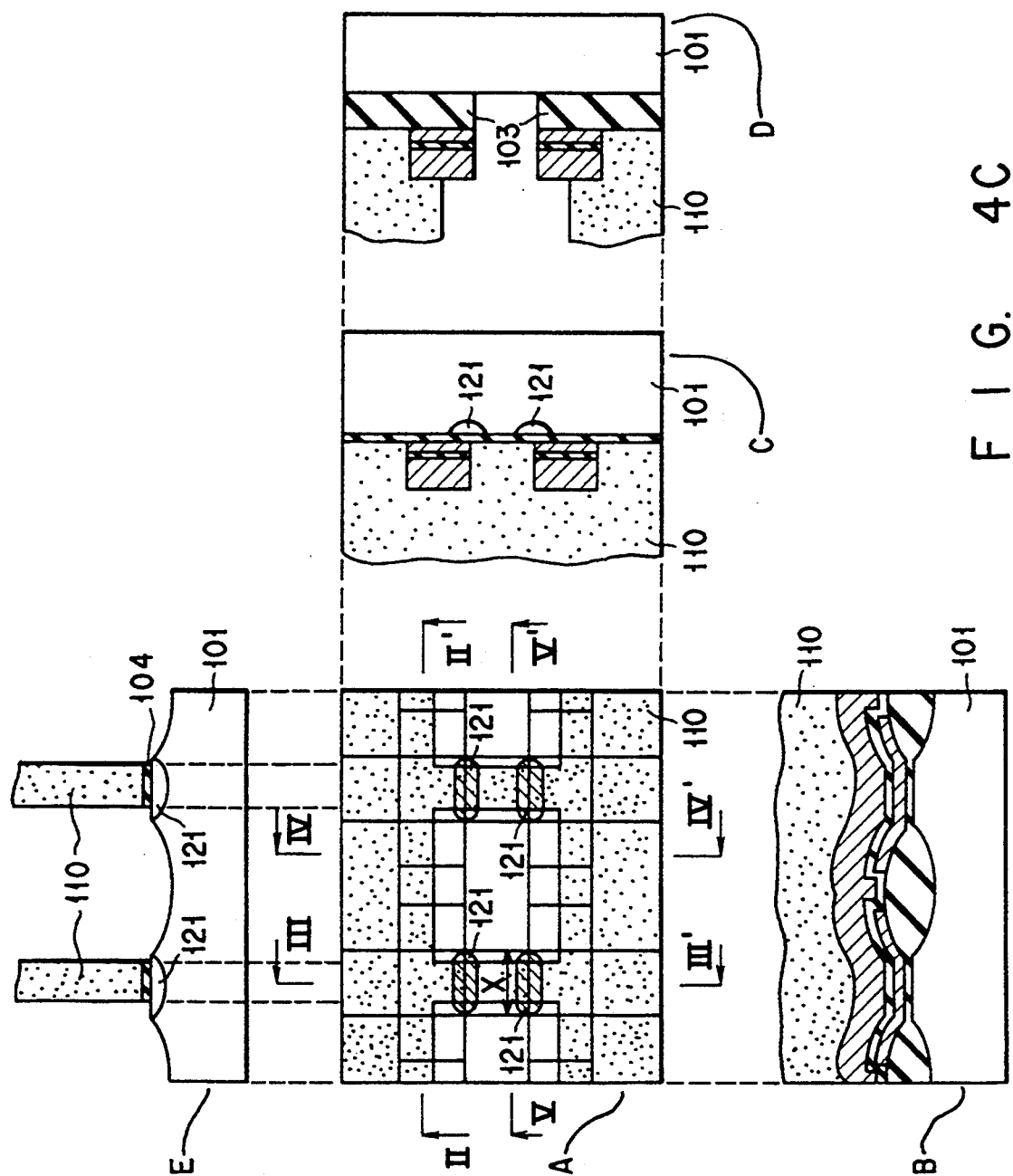
FIG. 4C shows a plan view at A and cross sectional views at B, C, D, E showing another step following the step of FIG. 3, and the cross sectional view at B is taken along line II–II', the cross sectional view at C is taken along line III–III', the cross sectional view at D is taken along line IV–IV', and the cross sectional view at E is taken along line V–V'.

In the example of FIG. 4C, even if a gate-to-gate area including those source regions is formed over a range narrower than a gate width X as shown in FIG. 4C, cross sectional view at E, so long as the substantial source region 121 is protected, the characteristic of the source region is maintained and it is possible to obtain an advantage of the present invention. From the shape of an element including the first and second insulating films 103, 105, etc., as shown in FIG. 4C, cross sectional view at E, it is sometimes not possible to determine that the semiconductor device of the present invention is formed by so doing.

It is needless to say that any shape other than those shown in FIGS. 4A to 4C can produce the same advantage as set out above so long as the resist 110 is properly so distributed as to protect a substantial source region.

Figure 5:
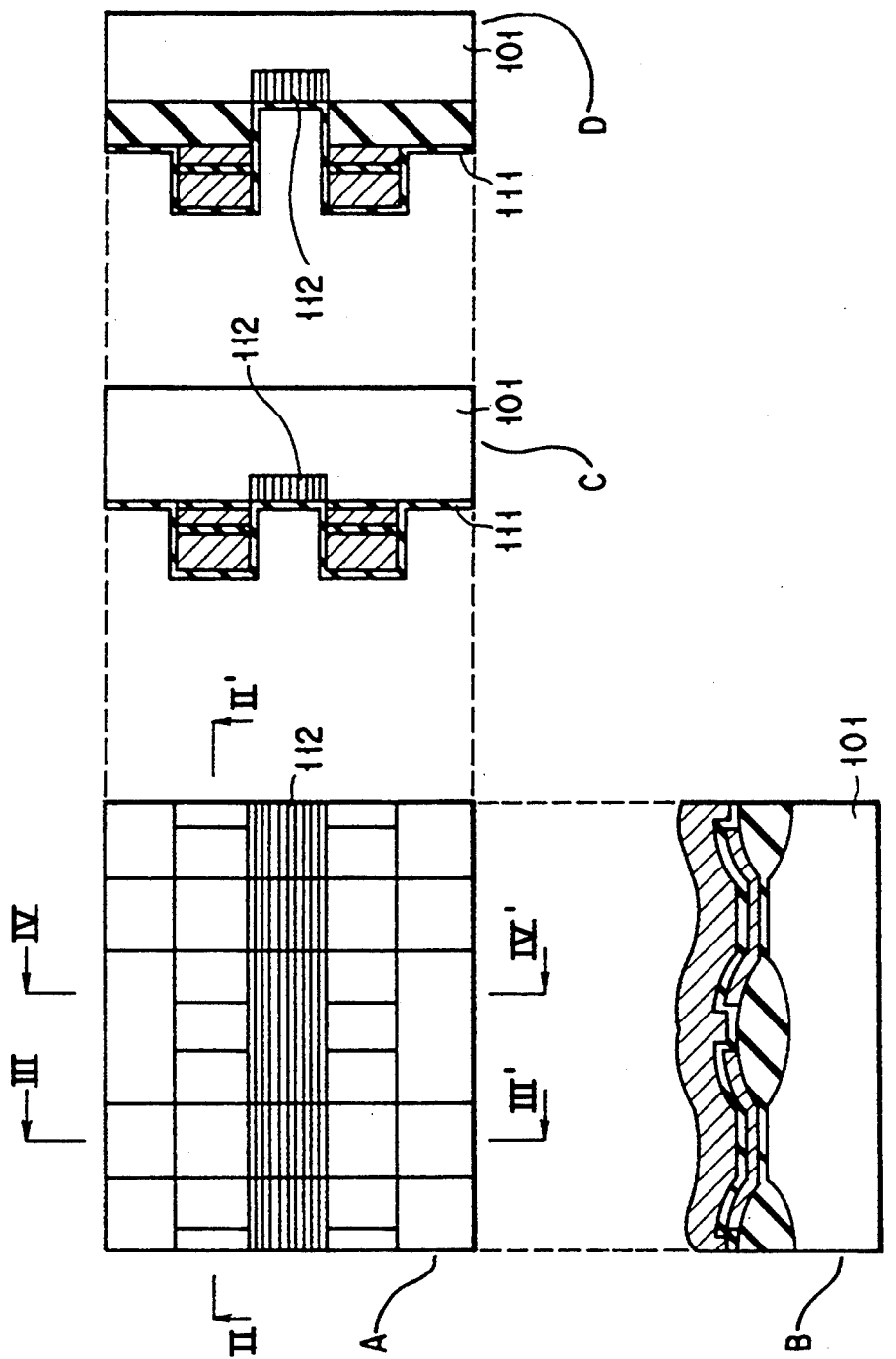
FIG. 5 shows a plan view at A and cross sectional views at B, C, D showing another step following the step of FIG. 4, and the cross sectional view at B is taken along line II–II', the cross sectional view at C is taken along line III–III', and the cross sectional view at D is taken along line IV–IV'.

Subsequent the removing the aforementioned resist pattern 110 and forming an oxide film on the whole surface of the resultant semiconductor structure by the thermal oxidation method as shown in FIG. 5, a resist is coated on the surface of the structure and a patterning step is done so as to implant an ion into a source region 112.

An As (arsenic) ion, for example, is implanted into the semiconductor structure at a dose of $5 \times 10^{15}$ cm$^{-2}$ and an acceleration voltage of 40 KeV and a phosphorus (P) ion is implanted into the semiconductor structure at a dose of $5 \times 10^{13}$ cm$^{-2}$ and an acceleration voltage of 40 Kev to provide the source region 112. Then a resist pattern is removed from the rest of the structure.

Figure 6:
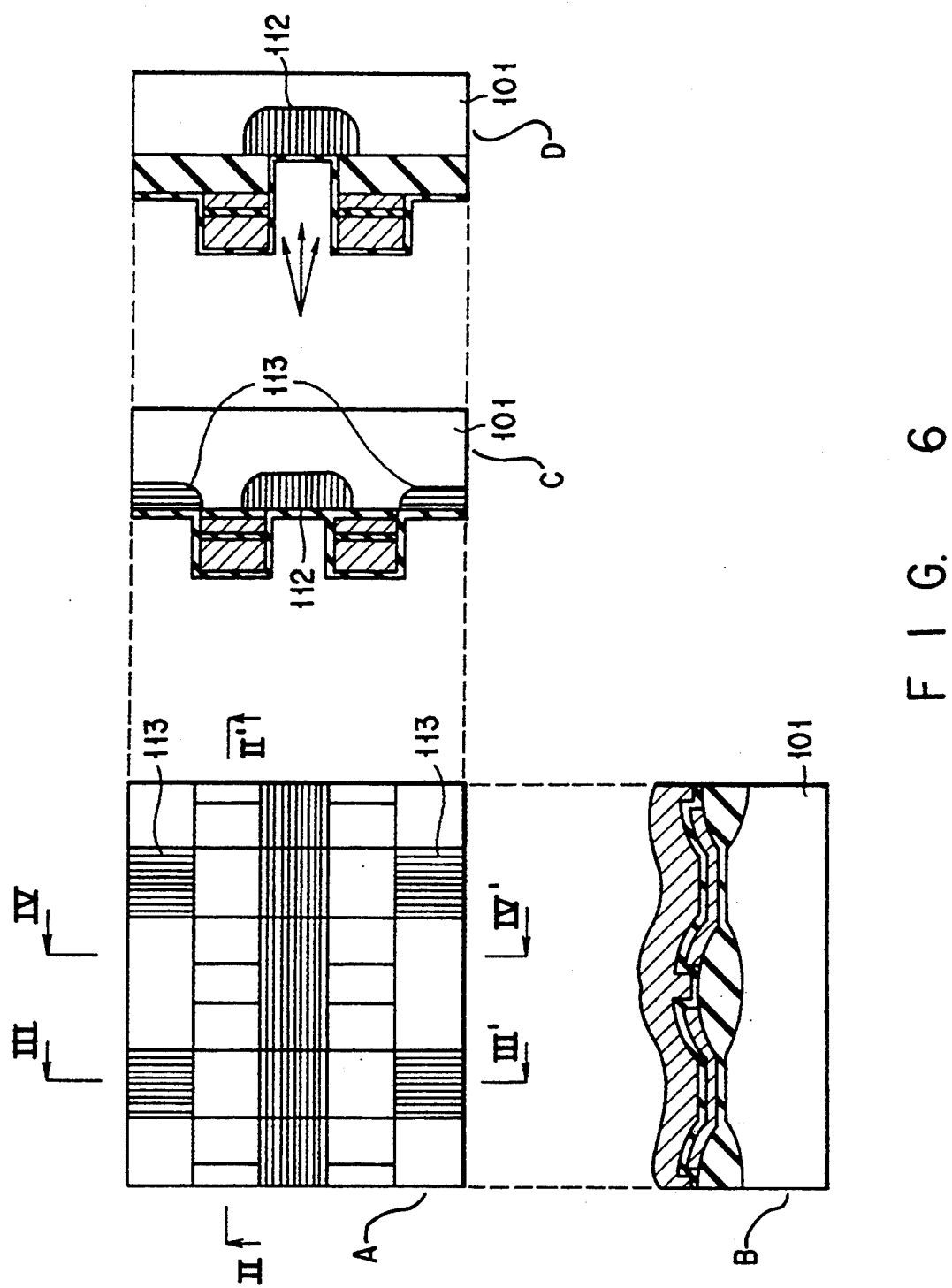
FIG. 6 shows a plan view at A and cross sectional views at B, C, D showing another step following the step of FIG. 5, and the cross sectional view at B is taken along line II–II', the cross sectional view at C is taken along line III–III', and the cross sectional view at D is taken along line IV–IV'; of FIG. 5.
Figure 7:
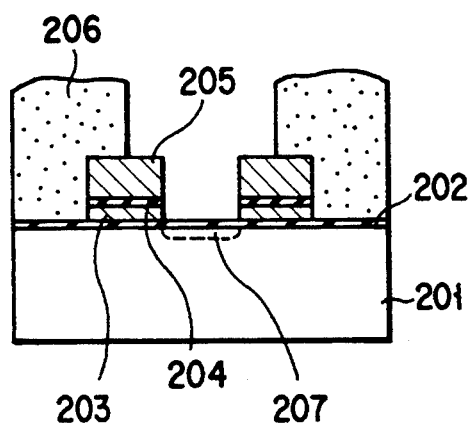
FIG. 7 is a cross-sectional view showing one of the steps of manufacturing a nonvolatile semiconductor memory device in a case where the method of the present invention is not applied.

In order to diffuse an impurity ion into the source region 112, a heating step (an annealing step) is carried out in a nitrogen atmosphere, for example, for 30 minutes at 1000° C. A resist is coated on the surface of the semiconductor structure and a patterning step is done for ion implantation into a drain region. An As ion for example is implanted at a dose of $5 \times 10^{15}$ cm$^{-2}$ and an acceleration voltage of 40 Kev to provide a drain region 113 as shown in FIG. 6.

Then, as well known in the art, an interlevel insulating layer is deposited over the structure, contact holes are opened at predetermined places in the interlevel insulating film, and an aluminum film, etc., are evaporated as an interconnect layer over the semiconductor layer, followed by the step of patterning at predetermined places. Subsequent to depositing a protective film over the whole surface, etc., an ETOX type EEPROM is completed.

In the manufacture of the ETOX type EEPROM by the aforementioned method, prior to forming a source line, a resist 110 is coated over the whole surface of a semiconductor structure through the use of the SAS technique and a gate-to-gate area including those source regions 121 is covered, in a gate element 108 distribution direction, with a resist over a range somewhat broader than the gate width X. Upon the removal of the field oxide film 103 not covered with the resist 110, the element area is not overetched. Further a variation in the width X of the channel adjacent to the source region 112 as shown in FIG. 4 can be minimized through the use of the SAS technique, resulting in a decrease in variation of the erasing characteristic of a cell involved. The self-alignment of the source line 112 can be indirectly achieved relative to a dual polysilicon gate electrode line, thus making, a zero, a distance between the source line and the gate. It is, therefore, possible to obtain a high integration cell as a microminiaturized unit.

Although the aforementioned embodiment has been explained in connection with the manufacturing process, the present invention can also apply to the manufacture of an EPROM as will be set forth below. Like the aforementioned embodiment, a resist is coated over the whole surface of a semiconductor structure prior to forming a source line. A gate-to-gate area including source regions 121 is covered, in a gate element (108) distribution direction, with a resist over a range somewhat broader than a gate width X, followed by a patterning step. This can avoid an overetching and ensures a stabilized cell characteristic. During the manufacturing process of the EPROM, the ion implantation is ingeniously effected into the source region in a direction parallel to a source region and is so done twice from an oblique direction, once in one direction (one of right and left directions) at an angle of 7° to 8° and once in the other direction at an angle of 7° to 8° to the substrate surface. By so doing it is necessary to prevent a rise in the resistance of the source line. This is because, when an ion implantation is effected at a place in the semiconductor substrate 101 as indicated by an arrow in FIG. 4A, cross sectional view at E, that is, at a place where an insulating film 103 is left, if this is so done in a vertical direction, then ion implantation cannot be adequately carried out due to the presence of the insulating film. It is, therefore, desired that the ion implantation be performed from a thinner portion of the insulating film at a proper angle.

Figure 9:
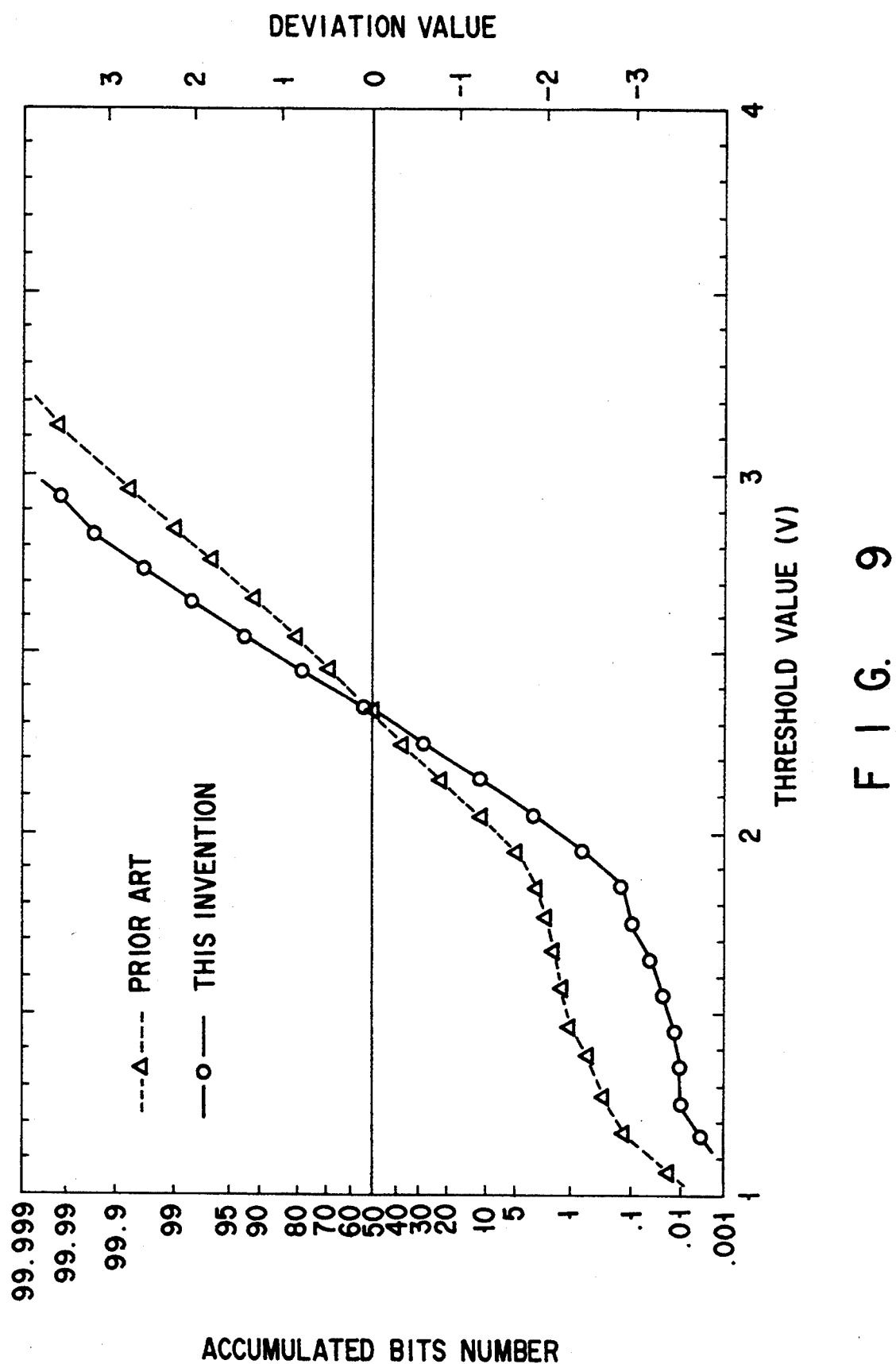
FIG. 9 is a graph showing a normal distribution of the threshold value of ETOX EEPROM at data cancellation to exhibit an advantage of the present invention over the prior art.

FIG. 9 shows a normal distribution graph for the threshold value of an ETOX type EEPROM at data cancellation. From this graph it will be seen that, according to the present embodiment, there is much less variation in the threshold values of the ETOX type EEPROM resulting from the stable characteristic of the source region. Let it be assumed that, for example, 2.3 V = the ideal value. Then it will follow that the cumulative percentage up to 1.95 v is improved to about 0.8% against 5% (conventional) and the cumulative percentage up to 2.7 V to about 98% against 90% (conventional).

According to the present invention, it is possible to provide a nonvolatile semiconductor memory device having source regions of high reliability, because element areas are not damaged by an overetching which would occur in a conventional semiconductor memory device.

Further, the present invention also provides a method for manufacturing a nonvolatile semiconductor memory device capable of achieving an ETOX type EEPROM which can suppress a variation in the characteristic of cells to the lowest extent and has a microminiaturized structure of advantage including source regions of high reliability.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device comprising the steps of:
    forming a first insulating film by forming a plurality of parallel insulative strips on a major surface of a semiconductor substrate of a first conductivity type, said insulative strips extending in a first direction on said major surface and having spacings therebetween;
    forming a second insulating film in the spacings between said insulative strips;
    forming a first conductive layer by forming a plurality of first conducting strips on said second insulating film;
    forming a second conducting layer on the resulting structure by forming a plurality of second conductive strips extending in a second direction perpendicular to the first direction;
    coating the resultant structure with a resist and patterning the resist so that a source area portion of an element area of the resulting structure is substantially covered with said resist;
    removing portions of said insulative strips at those areas not covered by the resist;
    removing the resist;
    forming a third insulating film on the resulting structure by thermal oxidation; and
    implanting an impurity of a second conductivity type into said source area portion of said element area.

2. The method according to claim 1, further comprising the steps of:
    thermally annealing the resulting structure; and
    implanting an impurity in the surface portion of said semiconductor substrate to form a drain region.

3. The method according to claim 1, wherein said element region includes at least two gates separated by a distance and having the source region therebetween, and the step of patterning the resist comprises patterning the resist so that the pattern of the resist is wider than the distance between said two gates.

4. The method according to claim 1, wherein said element region includes at least two gates separated by a distance and having the source region therebetween, and the step of patterning the resist comprises patterning the resist so that a portion of said element region is not covered by said resist.

5. The method according to claim 1, wherein said element region includes at least two gates separated by a distance and having the source region therebetween, and the step of patterning the resist comprises patterning the resist so that the pattern of the resist is narrower than the distance between said two gates.

6. The method according to claim 1, wherein the step of implanting an impurity comprises implanting the impurity along a path whose direction forms an oblique angle with respect to a direction perpendicular to said major surface of said semiconductor substrate.

7. The method according to claim 2, wherein the step of implanting an impurity comprises implanting the impurity along a path whose direction forms an oblique angle with respect to a direction perpendicular to said major surface of said semiconductor substrate.

8. The method according to claim 1, wherein said first insulating film is thicker than the second insulating film.

9. The method according to claim 1, wherein said first conductive strips have substantially the same width as said second conductive strips.

* * * * *

UNITED STATES PATENT AND TRADEMARK OFFICE
CERTIFICATE OF CORRECTION

PATENT NO. : 5,432,109
DATED : July 11, 1995
INVENTOR(S) : Seiji YAMADA

It is certified that error appears in the above-indentified patent and that said Letters Patent is hereby corrected as shown below:

On the title page: and Col. 1, line 2-3,

Item: [54] on the first page of the patent, the title "DEVICE METHOD FOR MANUFACTURING A SEMICONDUCTOR MEMORY" should be --METHOD FOR MANUFACTURING A SEMICONDUCTOR MEMORY DEVICE.

Signed and Sealed this

Fifth Day of March, 1996

*Attest:*

BRUCE LEHMAN

*Attesting Officer*     Commissioner of Patents and Trademarks